United States Patent
Terasaki et al.

(10) Patent No.: US 10,497,585 B2
(45) Date of Patent: Dec. 3, 2019

(54) BONDED BODY, SUBSTRATE FOR POWER MODULE WITH HEAT SINK, HEAT SINK, METHOD FOR PRODUCING BONDED BODY, METHOD FOR PRODUCING SUBSTRATE FOR POWER MODULE WITH HEAT SINK, AND METHOD FOR PRODUCING HEAT SINK

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/786,786

(22) Filed: Oct. 18, 2017

(65) Prior Publication Data

US 2018/0068871 A1 Mar. 8, 2018

Related U.S. Application Data

(62) Division of application No. 15/566,817, filed as application No. PCT/JP2016/061691 on Apr. 11, 2016.

(30) Foreign Application Priority Data

Apr. 16, 2015 (JP) .................................. 2015-084029
Feb. 24, 2016 (JP) .................................. 2016-033201

(51) Int. Cl.
*H05B 3/20* (2006.01)
*H05B 3/26* (2006.01)
(Continued)

(52) U.S. Cl.
CPC ...... *H01L 21/4882* (2013.01); *H01L 21/4871* (2013.01); *H01L 23/3735* (2013.01);
(Continued)

(58) Field of Classification Search
CPC ................ H05B 3/20–26; H05B 3/265; H05B 2203/00–002; H05B 2203/009; H01L 21/48; H01L 21/4871–4882
(Continued)

(56) References Cited

U.S. PATENT DOCUMENTS

2005/0067383 A1 3/2005 Ohashi et al.
2012/0148444 A1 6/2012 Nagaishi et al.

FOREIGN PATENT DOCUMENTS

JP 04-288983 A 10/1992
JP 3171234 B2 5/2001
(Continued)

OTHER PUBLICATIONS

English translation of JP 2014-060215 to Terasaki, published Apr. 3, 2014.*

(Continued)

*Primary Examiner* — Michael A LaFlame, Jr.
(74) *Attorney, Agent, or Firm* — Locke Lord LLP

(57) ABSTRACT

A bonded body is provided that is formed by bonding a metal member formed from copper, nickel, or silver, and an aluminum alloy member formed from an aluminum alloy of which a solidus temperature is lower than a eutectic temperature of aluminum and a metal element that constitutes the metal member. The aluminum alloy member and the metal member are subjected to solid-phase diffusion bonding. A chill layer, in which a Si phase of which an aspect ratio of a crystal grain is 2.5 or less and a crystal grain diameter is 15 μm or less is dispersed, is formed on a bonding interface side with the metal member in the alumi- (Continued)

num alloy member. The thickness of the chill layer is set to 50 μm or greater.

7 Claims, 9 Drawing Sheets

(51) Int. Cl.
    *H01L 21/48* (2006.01)
    *H01L 23/373* (2006.01)
    *H01L 23/473* (2006.01)

(52) U.S. Cl.
    CPC ........ *H01L 23/3736* (2013.01); *H01L 23/473* (2013.01); *H01L 2224/291* (2013.01); *H01L 2224/32225* (2013.01); *H01L 2224/83065* (2013.01)

(58) Field of Classification Search
    USPC .......................................... 219/78.02, 78.12
    See application file for complete search history.

(56) References Cited

FOREIGN PATENT DOCUMENTS

| | | | |
|---|---|---|---|
| JP | 2004-172378 | A | 6/2004 |
| JP | 2005-103556 | A | 4/2005 |
| JP | 2008-208442 | A | 9/2008 |
| JP | 2009-279643 | A | 12/2009 |
| JP | 2011-058056 | A | 3/2011 |
| JP | 2011-255389 | A | 12/2011 |
| JP | 2014-060215 | A | 4/2014 |
| JP | 2014-099596 | A | 5/2014 |
| JP | 2014-160799 | A | 9/2014 |
| WO | 2014/142310 | A1 | 9/2014 |

OTHER PUBLICATIONS

English translation of JP 2011-058056 to Nagaishi, published Mar. 24, 2011.*
International Search Report dated Jun. 28, 2016, issued for PCT/JP2016/061691 and English translation thereof.
Office Action dated Jul. 2, 2019, issued for the Chinese patent application No. 201680022306.4 and English translation thereof.

* cited by examiner

BONDED BODY, SUBSTRATE FOR POWER MODULE WITH HEAT SINK, HEAT SINK, METHOD FOR PRODUCING BONDED BODY, METHOD FOR PRODUCING SUBSTRATE FOR POWER MODULE WITH HEAT SINK, AND METHOD FOR PRODUCING HEAT SINK

This Application is a Division of application Ser. No. 15/566,817 filed on Oct. 16, 2017. Application PCT/JP2016/061691 claims priority for Application 2016-033201 filed on Feb. 24, 2016 in Japan. Application PCT/JP2016/061691 claims priority for Application 2015-084029 filed on Apr. 16, 2015 in Japan. The entire contents of these applications are incorporated herein by reference in their entirety.

TECHNICAL FIELD

The present invention relates to a bonded body that is formed by bonding a metal member formed from copper, nickel, or silver to an aluminum alloy member formed from an aluminum alloy of which a solidus temperature is lower than a eutectic temperature of aluminum and a metal element that constitutes the metal member, a power module substrate with heat sink which includes a power module substrate and a heat sink, a heat sink including a heat sink main body and a metal member layer, a method of manufacturing a bonded body, a method of manufacturing a power module substrate with heat sink, and a method of manufacturing a heat sink.

Priority is claimed on Japanese Patent Application No. 2015-084029, filed on Apr. 16, 2015, and Japanese Patent Application No. 2016-033201, filed on Feb. 24, 2016, the contents of which are incorporated herein by reference.

BACKGROUND ART

A semiconductor device such as an LED and a power module is provided with a structure in which a semiconductor element is bonded onto a circuit layer formed from a conductive material.

In a large-power control power semiconductor element that is used to control wind power generation, an electric vehicle, a hybrid car, and the like, the amount of heat generation is great. According to this, as a substrate on which the large-power control power semiconductor element is mounted, for example, a power module substrate including a ceramic substrate formed from aluminum nitride (AlN), alumina ($Al_2O_3$), and the like, and a circuit layer formed by bonding a metal plate with excellent conductivity on one surface of the ceramic substrate has been widely used in the related art. Furthermore, as the power module substrate, a power module substrate, in which a metal layer is formed on the other surface of the ceramic substrate, is also provided.

For example, a power module disclosed in PTL 1 has a structure including a power module substrate in which a circuit layer and a metal layer which are formed from Al are respectively formed on one surface and the other surface of a ceramic substrate, and a semiconductor element that is bonded onto the circuit layer through a solder material.

In addition, a heat sink is bonded to a metal layer side of the power module substrate to radiate heat, which is transferred from the semiconductor element to the power module substrate side, to an outer side through the heat sink.

However, as is the case with the power module described in PTL 1, in a case where the circuit layer and the metal layer are constituted by Al, an oxide film of Al is formed on a surface, and thus it is difficult to bond the semiconductor element or the heat sink onto the surface with the solder material.

Accordingly, in the related art, for example, as disclosed in PTL 2, after a Ni plating film is formed on the surface of the circuit layer and the metal layer through electroless plating and the like, the semiconductor element or the heat sink is subjected to solider-bonding.

In addition, PTL 3 suggests a technology of bonding the circuit layer and the semiconductor element, and the metal layer and the heat sink, respectively, by using silver oxide paste containing a reducing agent including silver oxide particles and an organic material as an alternative of the solder material.

However, as described in PTL 2, in the power module substrate in which the Ni plating film is formed on the surface of the circuit layer and the metal layer, during bonding of the semiconductor element and the heat sink, a surface of the Ni plating film deteriorates due to oxidation and the like, and thus there is a concern that bonding reliability of the semiconductor element and the heat sink which are bonded through the solder material deteriorates. Here, when bonding between the heat sink and the metal layer is not sufficient, there is a concern that heat resistance increases, and thus heat dissipation characteristics deteriorate. In addition, in a Ni plating process, a masking process may be performed in order prevent problems such as electrolytic corrosion due to formation of the Ni plating in an unnecessary region from occurring. As described above, in a case of performing a plating process after performing the masking process, a great deal of labor is necessary in the process of forming the Ni plating film on the surface of the circuit layer and the surface of the metal layer, and thus there is a problem in that the manufacturing cost of the power module greatly increases.

In addition, as described in PTL 3, in a case of respectively bonding the circuit layer and the semiconductor element, and the metal layer and the heat sink by using the silver oxide paste, bondability between Al and a baked body of the silver oxide paste is poor, and thus it is necessary to form a Ag underlying layer on the surface of the circuit layer and the surface of the metal layer in advance. In a case of forming the Ag underlying layer through plating, there is a problem in that a great deal of labor is necessary similar to Ni plating.

Accordingly, PTL 4 suggests a power module substrate in which the circuit layer and the metal layer are set to have a laminated structure of an Al layer and a Cu layer. In the power module substrate, the Cu layer is disposed on the surface of the circuit layer and the metal layer, and thus it is possible to bond the semiconductor element and the heat sink by using a solder material in a satisfactory manner. As a result, heat resistance in a laminating direction decreases, and thus it is possible to transfer heat, which is generated from the semiconductor element, to the heat sink side in a satisfactory manner.

In addition, PTL 5 suggests a power module substrate with heat sink in which one of the metal layer and the heat sink is constituted by aluminum or an aluminum alloy, the other side is constituted by copper or a copper alloy, and the metal layer and the heat sink are subjected to solid-phase diffusion bonding. In the power module substrate with heat sink, the metal layer and the heat sink are subjected to the solid-phase diffusion bonding, and thus heat resistance is small, and heat dissipation characteristics are excellent.

CITATION LIST

Patent Literature

[PTL 1] Japanese Patent Publication No. 3171234
[PTL 2] Japanese Unexamined Patent Application, First Publication No. 2004-172378
[PTL 3] Japanese Unexamined Patent Application, First Publication No. 2008-208442
[PTL 4] Japanese Unexamined Patent Application, First Publication No. 2014-160799
[PTL 5] Japanese Unexamined Patent Application, First Publication No. 2014-099596

DISCLOSURE OF INVENTION

Technical Problem

However, in a heat sink having a complicated structure in which a flow passage of a cooling medium and the like are formed on an inner side, the heat sink may be manufactured with a casted aluminum alloy having a relatively low solidus temperature.

Here, in a case of subjecting the aluminum alloy member formed from the casted aluminum alloy having the low solidus temperature, and the metal member formed from copper or a copper alloy to the solid-phase diffusion bonding as described in PTL 5, it is confirmed that a lot of Kirkendall voids, which occur due to unbalance of mutual diffusion, occur in the vicinity of a bonding interface. When the Kirkendall voids exist between the power module substrate and the heat sink, heat resistance increases, and thus there is a problem in that heat dissipation characteristics deteriorate.

The invention has been made in consideration of the above-described circumstances, and an object thereof is to provide a bonded body in which an aluminum alloy member formed from an aluminum alloy having a relatively low solidus temperature, and a metal member formed from copper, nickel, or silver are bonded to each other in a satisfactory manner, and heat resistance in a laminating direction is low, a power module substrate with heat sink and a heat sink which include the bonded body, a method of manufacturing a bonded body, and a method of manufacturing a power module substrate with heat sink, and a method of manufacturing a heat sink.

Solution to Problem

To solve the above-described problem, according to an aspect of the invention, a bonded body is provided, formed by bonding a metal member formed from copper, nickel, or silver, and an aluminum alloy member formed from an aluminum alloy of which a solidus temperature is lower than a eutectic temperature of aluminum and a metal element that constitutes the metal member. The aluminum alloy member and the metal member are subjected to solid-phase diffusion bonding. A chill layer, in which a Si phase of which an aspect ratio of a crystal grain is 2.5 or less and a crystal grain diameter is 15 μm or less is dispersed, is formed on a bonding interface side with the metal member in the aluminum alloy member. The thickness of the chill layer is set to 50 μm or greater.

Furthermore, in the aspect of the invention, the metal member is constituted by copper or a copper alloy, nickel or a nickel alloy, or silver or a silver alloy.

According to the bonded body configured as described above, the chill layer, in which a Si phase of which an aspect ratio (major axis/minor axis) of a crystal grain is 2.5 or less and a crystal grain diameter is 15 μm or less is dispersed, is formed on the bonding interface side with the metal member in the aluminum alloy member, and the thickness of the chill layer is set to 50 μm or greater. Accordingly, it is possible to obstruct diffusion migration of a metal element that constitutes the metal member due to the chill layer, and thus occurrence of a Kirkendall void is suppressed. As a result, it is possible to lower heat resistance in a laminating direction.

According to another aspect of the invention, a power module substrate with heat sink is provided, including an insulating layer, a circuit layer that is formed on one surface of the insulating layer, a metal layer that is formed on the other surface of the insulating layer, and a heat sink that is disposed on a surface, which is opposite to the insulating layer, of the metal layer. In the metal layer, a bonding surface with the heat sink is constituted by copper, nickel, or silver. In the heat sink, a bonding surface with the metal layer is constituted by an aluminum alloy of which a solidus temperature is lower than a eutectic temperature of aluminum and a metal element that constitutes the bonding surface of the metal layer. The heat sink and the metal layer are subjected to solid-phase diffusion bonding. A chill layer, in which a Si phase of which an aspect ratio of a crystal grain is 2.5 or less and a crystal grain diameter is 15 μm or less is dispersed, is formed on a bonding interface side with the metal layer in the heat sink. The thickness of the chill layer is set to 50 mm or greater.

According to the power module substrate with heat sink which is configured as described above, the chill layer, in which a Si phase of which an aspect ratio (major axis/minor axis) of a crystal grain is 2.5 or less and a crystal grain diameter is 15 μm or less is dispersed, is formed on the bonding interface side with the metal layer in the heat sink, and the thickness of the chill layer is set to 50 μm or greater. Accordingly, it is possible to obstruct diffusion migration of a metal element that constitutes the metal layer due to the chill layer, and thus occurrence of a Kirkendall void is suppressed. As a result, heat resistance is low and heat dissipation characteristics are particularly excellent.

According to still another aspect of the invention, a heat sink is provided, including a heat sink main body, and a metal member layer. The metal member layer is formed from copper, nickel, or silver. The heat sink main body is constituted by an aluminum alloy of which a solidus temperature is lower than a eutectic temperature of aluminum and a metal element that constitutes the metal member layer. A chill layer, in which a Si phase of which an aspect ratio of a crystal grain is 2.5 or less and a crystal grain diameter is 15 μm or less is dispersed, is formed on a bonding interface side with the metal member layer in the heat sink main body. The thickness of the chill layer is set to 50 μm or greater.

According to the heat sink configured as described above, the chill layer, in which a Si phase of which an aspect ratio (major axis/minor axis) of a crystal grain is 2.5 or less and a crystal grain diameter is 15 μm or less is dispersed, is formed on the bonding interface side with the metal member layer in the heat sink main body, and the thickness of the chill layer is set to 50 μm or greater. Accordingly, it is possible to obstruct diffusion migration of a metal element that constitutes the metal member layer due to the chill layer, and thus occurrence of a Kirkendall void is suppressed. As a result, heat resistance is low and heat dissipation characteristics are particularly excellent.

According to still another aspect of the invention, a method is provided of manufacturing a bonded body that is formed by bonding a metal member formed from copper, nickel, or silver, and an aluminum alloy member formed from an aluminum alloy of which a solidus temperature is lower than a eutectic temperature of aluminum and a metal element that constitutes the metal member. A chill layer, in which a Si phase of which an aspect ratio of a crystal grain is 2.5 or less and a crystal grain diameter is 15 μm or less is dispersed, is formed on a bonding surface side with the metal member in the aluminum alloy member before bonding, and the thickness of the chill layer is set to 80 μm or greater. The aluminum alloy member and the metal member are subjected to solid-phase diffusion bonding.

According to the method of manufacturing a bonded body which is configured as described above, the chill layer, in which a Si phase of which an aspect ratio of a crystal grain is 2.5 or less and a crystal grain diameter is 15 μm or less is dispersed, is formed on a bonding surface side with the metal member in the aluminum alloy member before bonding, and the thickness of the chill layer is set to 80 μm or greater. Accordingly, it is possible to suppress diffusion migration of a metal element, which constitutes the metal member, more than necessary during the solid-phase diffusion bonding, and thus it is possible to suppress occurrence of a Kirkendall void.

Furthermore, a metal element, which constitutes the metal member, may diffuse to a part of the chill layer during the solid-phase diffusion bonding in accordance with the metal element that constitutes the metal member, and a diffusion bonding layer may be formed. Accordingly, the thickness of the chill layer after bonding may be smaller than the thickness of the chill layer before bonding.

Here, in the method of manufacturing a bonded body according to the aspect of the invention, it is preferable that the aluminum alloy member and the metal member be laminated and electrically heated while being pressurized in a laminating direction to subject the aluminum alloy member and the metal member to the solid-phase diffusion bonding.

In this case, since the aluminum alloy member and the metal member are electrically heated while being pressurized in the laminating direction, it is possible to raise a temperature-rising rate, and thus it is possible to perform the solid-phase diffusion bonding in relatively short time. According to this, for example, even when bonding is performed in the atmosphere, an effect of oxidization on the bonding surface is small, and thus it is possible to bond the aluminum alloy member and the metal member in a satisfactory manner.

According to still another aspect of the invention, a method is provided of manufacturing a power module substrate with heat sink which includes an insulating layer, a circuit layer that is formed on one surface of the insulating layer, a metal layer that is formed on the other surface of the insulating layer, and a heat sink that is disposed on a surface, which is opposite to the insulating layer, of the metal layer. In the metal layer, a bonding surface with the heat sink is constituted by copper, nickel, or silver. In the heat sink, a bonding surface with the metal layer is constituted by an aluminum alloy of which a solidus temperature is lower than a eutectic temperature of aluminum and a metal element that constitutes the bonding surface of the metal layer. A chill layer, in which a Si phase of which an aspect ratio of a crystal grain is 2.5 or less and a crystal grain diameter is 15 μm or less is dispersed, is formed on a bonding surface side with the metal layer in the heat sink before bonding, and the thickness of the chill layer is set to 80 μm or greater. The heat sink and the metal layer are subjected to solid-phase diffusion bonding.

According to the method of manufacturing a power module substrate with heat sink which is configured as described above, the chill layer, in which a Si phase of which an aspect ratio of a crystal grain is 2.5 or less and a crystal grain diameter is 15 μm or less is dispersed, is formed on a bonding surface side with the metal layer in the heat sink before bonding, and the thickness of the chill layer is set to 80 μm or greater. Accordingly, it is possible to suppress diffusion migration of a metal element, which constitutes the bonding surface of the metal layer, more than necessary during the solid-phase diffusion bonding, and thus it is possible to suppress occurrence of a Kirkendall void.

As a result, it is possible to manufacture a power module substrate with heat sink in which heat resistance in the laminating direction is low and heat dissipation characteristics are excellent.

Here, in the method of manufacturing a power module substrate with heat sink according to the aspect of the invention, it is preferable that the heat sink and the metal layer be laminated and electrically heated while being pressurized in a laminating direction to subject the heat sink and the metal layer to the solid-phase diffusion bonding.

In this case, since the heat sink and the metal layer are electrically heated while being pressurized in the laminating direction, it is possible to raise a temperature-rising rate, and thus it is possible to perform the solid-phase diffusion bonding in relatively short time. According to this, for example, even when bonding is performed in the atmosphere, an effect of oxidization on the bonding surface is small, and thus it is possible to bond the heat sink and the metal layer in a satisfactory manner.

According to still another aspect of the invention, a method is provided of manufacturing a heat sink including a heat sink main body and a metal member layer. The metal member layer is formed from copper, nickel, or silver. The heat sink main body is constituted by an aluminum alloy of which a solidus temperature is lower than a eutectic temperature of aluminum and a metal element that constitutes the metal member layer. A chill layer, in which a Si phase of which an aspect ratio of a crystal grain is 2.5 or less and a crystal grain diameter is 15 μm or less is dispersed, is formed on a bonding surface side with the metal member layer in the heat sink main body before bonding, and the thickness of the chill layer is set to 80 μm or greater. The heat sink main body and the metal member layer are subjected to solid-phase diffusion bonding.

According to the method of manufacturing a heat sink which is configured as described, since the chill layer, in which a Si phase of which an aspect ratio of a crystal grain is 2.5 or less and a crystal grain diameter is 15 μm or less is dispersed, is formed on the bonding surface side with the metal member layer in the heat sink main body before bonding, and the thickness of the chill layer is set to 80 μm or greater, it is possible to suppress diffusion migration of a metal element, which constitutes the metal member layer, more than necessary during the solid-phase diffusion bonding, and thus it is possible to suppress occurrence of a Kirkendall void.

As a result, it is possible to manufacture a heat sink in which heat resistance in the laminating direction is low and heat dissipation characteristics are excellent.

Here, in the method of manufacturing a heat sink according to the aspect of the invention, it is preferable that the heat sink main body and the metal member layer be laminated, and be electrically heated while being pressurized in a laminating direction to subject the heat sink main body and the metal member layer to the solid-phase diffusion bonding.

In this case, since the heat sink main body and the metal member layer are electrically heated while being pressurized in the laminating direction, it is possible to raise a temperature-rising rate, and thus it is possible to perform the solid-phase diffusion bonding in relatively short time. According to this, for example, even when bonding is performed in the atmosphere, an effect of oxidization on the bonding surface is small, and thus it is possible to bond the heat sink main body and the metal member layer in a satisfactory manner.

Advantageous Effects of Invention

According to the aspects of the invention, it is possible to provide a bonded body in which an aluminum alloy member formed from an aluminum alloy having a relatively low solidus temperature, and a metal member formed from copper, nickel, or silver are bonded to each other in a satisfactory manner, and heat resistance in a laminating direction is low, a power module substrate with heat sink and a heat sink which include the bonded body, a method of manufacturing a bonded body, and a method of manufacturing a power module substrate with heat sink, and a method of manufacturing a heat sink.

BEST MODE FOR CARRYING OUT THE INVENTION

First Embodiment

Hereinafter, description will be given of embodiments of the invention with reference to the accompanying drawings.

Figure 1:
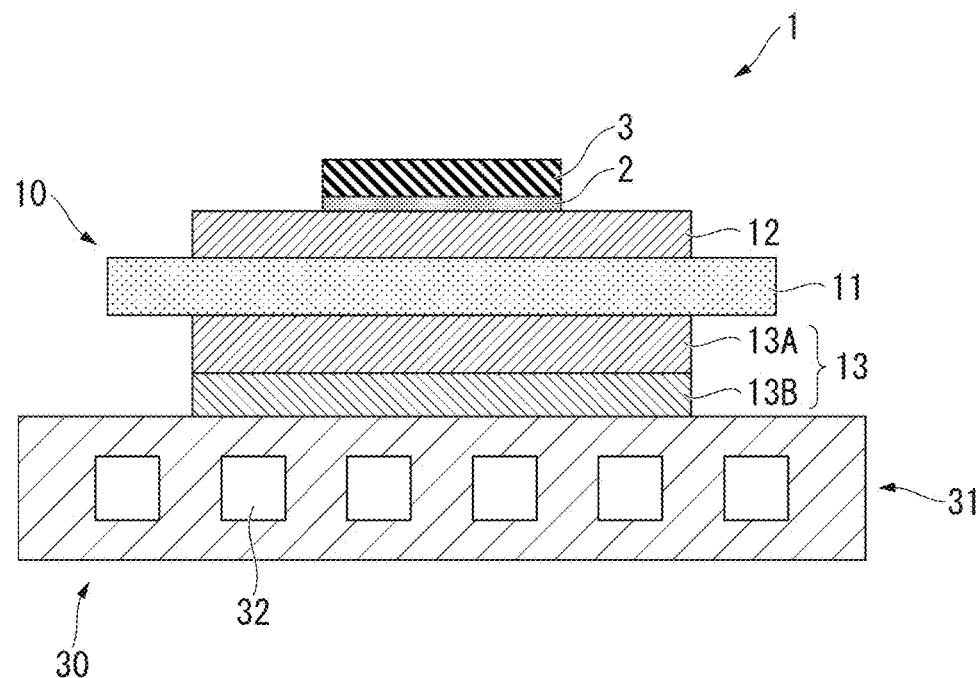
FIG. 1 is a schematic view illustrating a power module including a power module substrate with heat sink according to a first embodiment of the invention.

FIG. 1 illustrates a power module 1 using a power module substrate with heat sink 30 according to a first embodiment of the invention.

The power module 1 includes the power module substrate with heat sink 30, and a semiconductor element 3 that is bonded to one surface (an upper surface in FIG. 1) of the power module substrate with heat sink 30 through a solder layer 2.

The power module substrate with heat sink 30 includes a power module substrate 10 and a heat sink 31 that is bonded to the power module substrate 10.

The power module substrate 10 includes a ceramic substrate 11 that constitutes an insulating layer, a circuit layer 12 that is arranged on one surface (an upper surface in FIG. 1) of the ceramic substrate 11, and a metal layer 13 that is arranged on the other surface of the ceramic substrate 11.

The ceramic substrate 11 is constituted by ceramics such as silicon nitride ($Si_3N_4$), aluminum nitride (AlN), and alumina ($Al_2O_3$), which are excellent in insulating properties and heat dissipation. In this embodiment, the ceramic member 11 is constituted by the aluminum nitride (AlN), which is particularly excellent in heat dissipation. In addition, for example, the thickness of the ceramic substrate 11 is set in a range of 0.2 mm to 1.5 mm, and is set to 0.635 mm in this embodiment.

Figure 4:
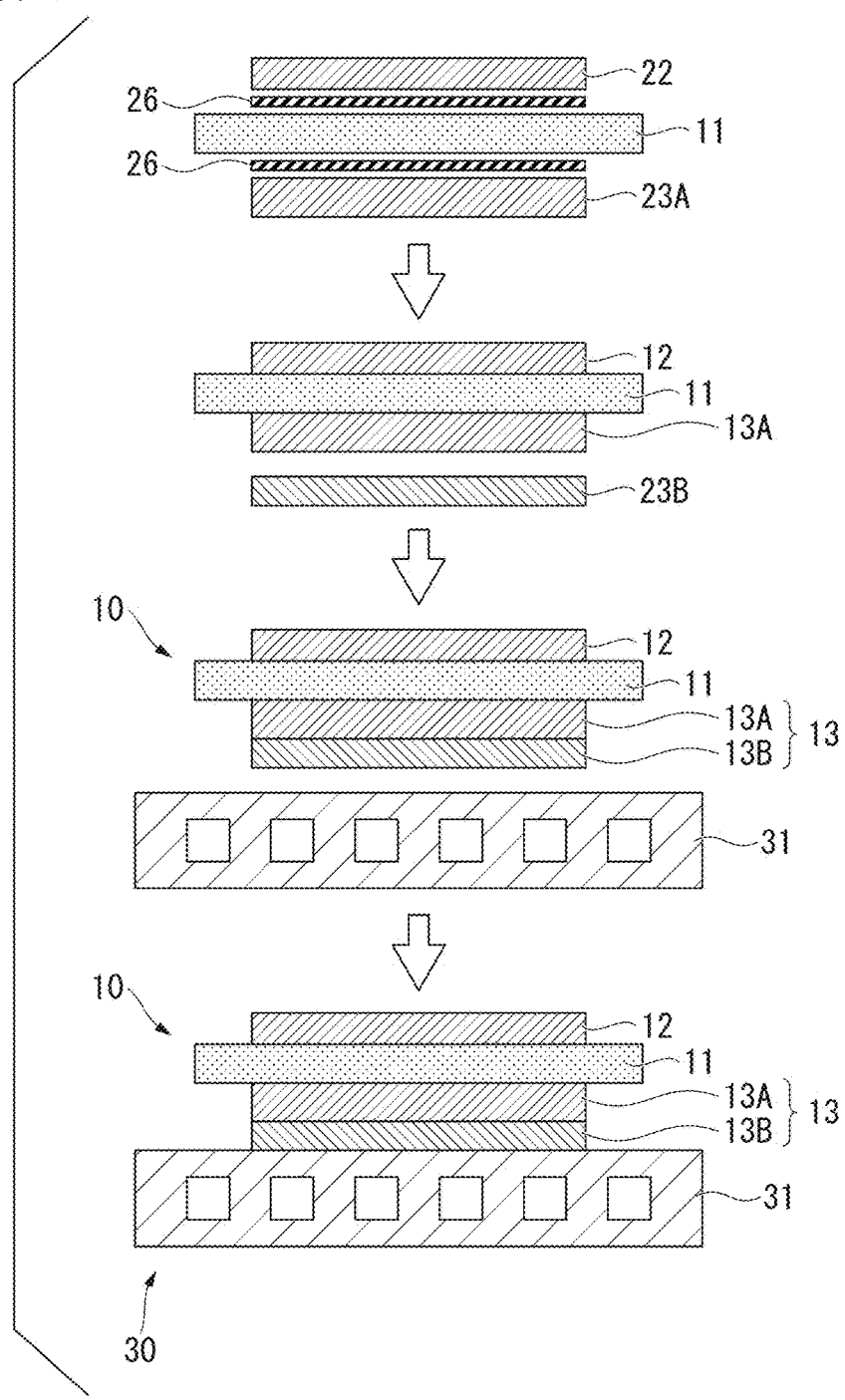
FIG. 4 is a schematic view illustrating the method of manufacturing the power module substrate with heat sink according to the first embodiment.

As illustrated in FIG. 4, the circuit layer 12 is formed by bonding an aluminum plate 22, which is formed from aluminum or an aluminum alloy, onto one surface of the ceramic substrate 11. In this embodiment, the circuit layer 12 is formed by bonding a rolled plate (aluminum plate 22) of aluminum (2N aluminum) having the purity of 99 mass % or greater to the ceramic substrate 11. Furthermore, the thickness of the aluminum plate 22, which becomes the circuit layer 12, is set in a range of 0.1 mm to 1.0 mm, and is set to 0.6 mm in this embodiment.

As illustrated in FIG. 1, the metal layer 13 includes an Al layer 13A that is arranged on the other surface of the ceramic substrate 11, and a Cu layer 13B that is laminated on a surface, which is opposite to a surface to which the ceramic substrate 11 is bonded, of the Al layer 13A.

As illustrated in FIG. 4, the Al layer 13A is formed by bonding an aluminum plate 23A, which is formed from aluminum or an aluminum alloy, onto the other surface of the ceramic substrate 11. In this embodiment, the Al layer 13A is formed by bonding a rolled plate (aluminum plate 23A) of aluminum (2N aluminum) having the purity of 99 mass % or greater to the ceramic substrate 11. The thickness of the aluminum plate 23A that is bonded to the ceramic substrate 11 is set in a range of 0.1 mm to 3.0 mm, and is set to 0.6 mm in this embodiment.

As illustrated in FIG. 4, the Cu layer 13B is formed by bonding a copper plate 23B, which is formed from copper or a copper alloy, to the other surface of the Al layer 13A. In this embodiment, the Cu layer 13B is formed by bonding a rolled plate (copper plate 23B) of oxygen-free copper to the other surface of the Al layer 13A. The thickness of the copper layer 13B is set in a range of 0.1 mm to 6 mm, and is set to 1 mm in this embodiment.

The heat sink 31 is configured to radiate heat on a power module substrate 10 side. In this embodiment, as illustrated in FIG. 1, the heat sink 31 is provided with a flow passage 32 through which a cooling medium flows. The heat sink 31 is constituted by a casted material of an aluminum alloy of which a solidus temperature is lower than a eutectic temperature (548° C.) of Al and Cu which constitutes a bonding surface (Cu layer 13B) of the metal layer 13. Specifically, the heat sink 31 is constituted by a casted material of ADC12 (solidus temperature: 515° C.), which is a Si-containing die-casting aluminum alloy defined in JIS H 2118:2006. Furthermore, the ADC12 is an aluminum alloy that contains Cu in a range of 1.5 mass % to 3.5 mass %, and Si in a range of 9.6 mass % to 12.0 mass %. In the casted material of the aluminum alloy, the amount of Si is preferably 1 mass % to 25 mass %, but there is no limitation thereto.

Figure 2:
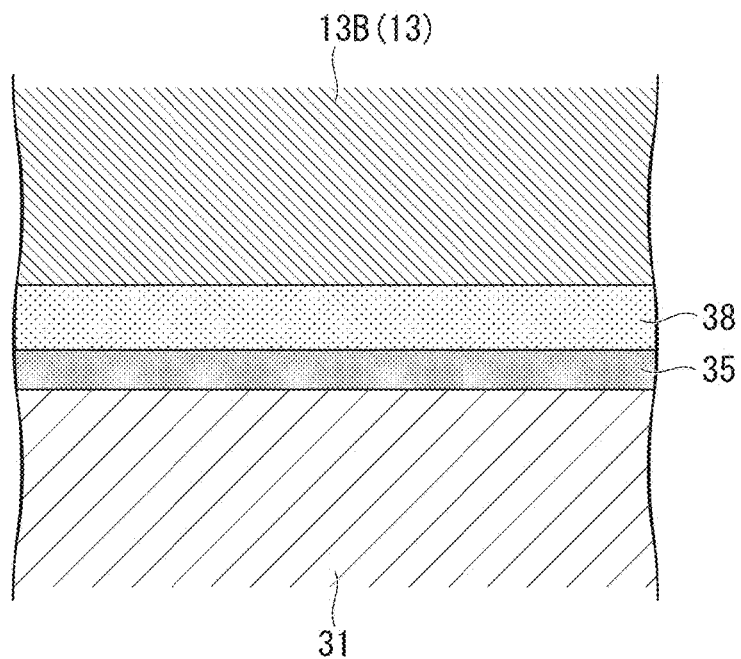
FIG. 2 is an enlarged cross-sectional view illustrating a bonding interface between a heat sink and a metal layer (Cu layer) of the power module substrate with heat sink as illustrated in FIG. 1.

As illustrated in FIG. 2, a chill layer 35 in which a Si phase of which an aspect ratio (major axis/minor axis) of a crystal grain is 2.5 or less and a crystal grain diameter is 15 μm or less is dispersed, is formed on a bonding interface side with the metal layer 13 (Cu layer 13B) in the heat sink 31. The aspect ratio (major axis/minor axis) of a crystal grain of the Si phase is preferably 1.0 to 2.0, and more preferably 1.0 to 1.5. The crystal grain diameter is preferably 0.5 μm to 10 μm, and more preferably 1 μm to 7 μm. However, there is no limitation to the ranges.

The chill layer 35 is formed in the vicinity of a surface layer portion of a casted material (portion in the vicinity of a casting mold) when forming the casted material that constitutes the heat sink 31. In the chill layer 35, the crystal grain diameter is finer and the aspect ratio is smaller in comparison to the inside of the casted material.

The thickness of the chill layer 35 (thickness thereof after bonding) of the power module substrate with heat sink 30 is set to 50 μm or greater. The thickness of the chill layer 35 is preferably 100 μm or greater, and more preferably 200 μm or greater, but there is no limitation to the ranges.

Here, the heat sink 31 and the metal layer 13 (Cu layer 13B) are subjected to solid-phase diffusion bonding.

As illustrated in FIG. 2, an intermetallic compound layer 38 is formed at a bonding interface between the metal layer 13 (Cu layer 13B) and the heat sink 31. That is, the intermetallic compound layer 38 is laminated on the chill layer 35 of the heat sink 31.

The intermetallic compound layer 38 is formed through mutual diffusion of Al atoms of the heat sink 31 and Cu atoms of the Cu layer 13B. The intermetallic compound layer 38 has a concentration gradient in which the concentration of Al atoms further decreases and the concentration of Cu atoms further increases as it goes toward the Cu layer 13B from the heat sink 31.

The intermetallic compound layer 38 is constituted by an intermetallic compound composed of Cu and Al. In this embodiment, the intermetallic compound layer 38 has a structure in which a plurality of the intermetallic compounds are laminated along the bonding interface. Here, the thickness of the intermetallic compound layer 38 is set in a range of 1 μm to 80 μm, and preferably in a range of 5 μm to 80 μm.

Furthermore, the intermetallic compound layer 38 is formed when Cu in the Cu layer 13B diffuses to the heat sink 31 (chill layer 35) side, and Si particles contained in the heat sink 31 are dispersed in the intermetallic compound layer 38.

In this embodiment, the intermetallic compound layer 38 has a structure in which three kinds of intermetallic compounds are laminated. In the order from the heat sink 31 side toward the Cu layer 13B side, a θ-phase and a $\eta_2$-phase are laminated along the bonding interface between the heat sink 31 and the Cu layer 13B, and at least one phase among a $\zeta_2$-phase, a δ-phase, and a $\gamma_2$-phase is laminated.

In addition, at the bonding interface between the intermetallic compound layer and the Cu layer 13B, oxides are dispersed in a layer shape along the bonding interface. Furthermore, in this embodiment, the oxides are composed of aluminum oxides such as alumina ($Al_2O_3$). Furthermore, the oxides are dispersed at the interface between the intermetallic compound layer and the Cu layer 13B in a disconnected state, and a region in which the intermetallic compound layer and the Cu layer 13B are in direct contact with each other also exists. In addition, the oxides may be dispersed at the inside of the θ-phase, the $\eta_2$-phase, or at least one phase among the $\zeta_2$-phase, the δ-phase, and the $\gamma_2$-phase in a layer shape.

Figure 3:
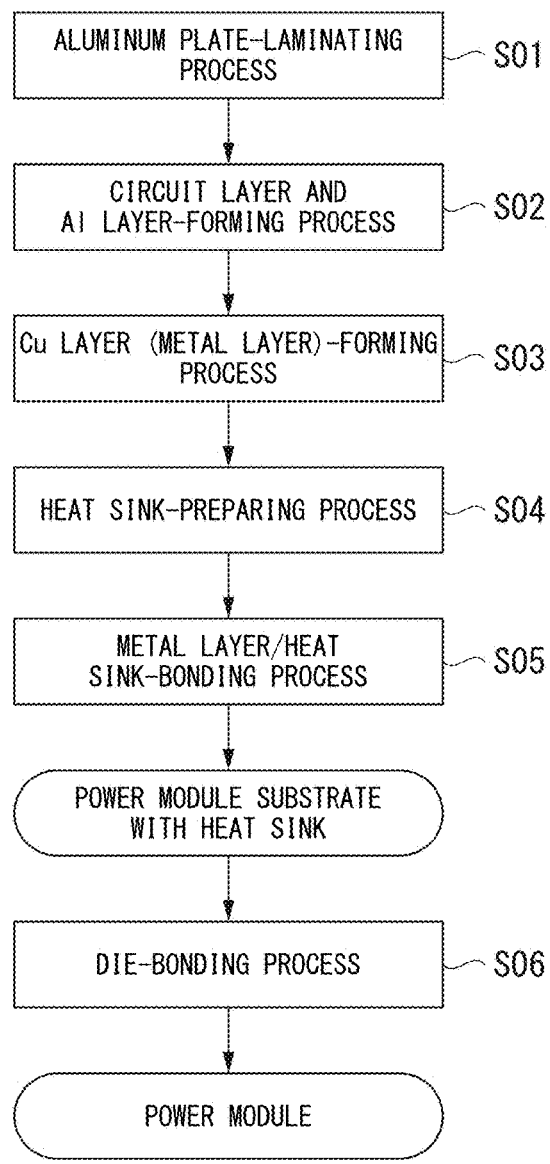
FIG. 3 is a flowchart illustrating a method of manufacturing the power module substrate with heat sink according to the first embodiment.
Figure 5:
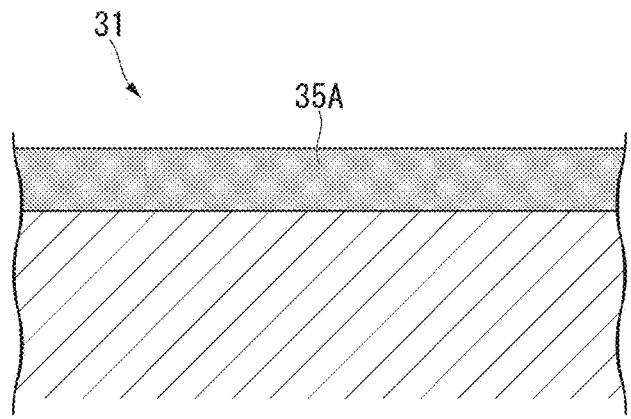
FIG. 5 is an enlarged cross-sectional view illustrating a bonding surface portion of a heat sink before bonding in the method of manufacturing the power module substrate with heat sink as illustrated in FIG. 4.

Next, description will be given of a method of manufacturing the power module substrate with heat sink 30 according to this embodiment with reference to FIG. 3 to FIG. 5.

(Aluminum Plate-Laminating Process S01)

First, as illustrated in FIG. 4, the aluminum plate 22, which becomes the circuit layer 12, is laminated on one surface of the ceramic substrate 11 through Al—Si-based brazing material foil 26.

In addition, the aluminum plate 23A, which becomes the Al layer 13A, is laminated on the other surface of the ceramic substrate 11 through Al—Si-based brazing material foil 26. Furthermore, in this embodiment, as the Al—Si-based brazing material foil 26, Al-8 mass % Si alloy foil having a thickness of 10 μm is used.

(Circuit Layer- and Al Layer-Forming Process S02)

In addition, the resultant laminated body is disposed in a vacuum heating furnace and is heated therein in a pressurized state (pressure is set to 1 to 35 kgf/cm$^2$ (0.10 to 3.43 MPa)) in a laminating direction to bond the aluminum plate 22 and the ceramic substrate 11, thereby forming the circuit layer 12. In addition, the ceramic substrate 11 and the aluminum plate 23A are bonded to form the Al layer 13A.

Here, it is preferable that the pressure inside the vacuum heating furnace be set in a range of 10$^{-6}$ Pa to 10$^{-3}$ Pa, a heating temperature be set to 600° C. to 650° C., and retention time be set in a range of 30 minutes to 180 minutes.

(Cu Layer (Metal Layer)-Forming Process S03)

Next, the copper plate 23B, which becomes the Cu layer 13B, is laminated on the other surface side of the Al layer 13A.

In addition, the resultant laminated body is disposed in a vacuum heating furnace and is heated therein in a pressurized state (pressure is set to 3 to 35 kgf/cm$^2$ (0.29 to 3.43 MPa)) in a laminating direction to subject the Al layer 13A and the copper plate 23B to solid-phase diffusion bonding, thereby forming the metal layer 13.

Here, it is preferable that the pressure inside the vacuum heating furnace be set in a range of 10$^{-6}$ Pa to 10$^{-3}$ Pa, a heating temperature be set to 400° C. to 548° C., and retention time be set in a range of 5 minutes to 240 minutes.

Furthermore, in respective bonding surfaces, which are subjected to the solid-phase diffusion bonding, of the Al layer 13A and the copper plate 23B, scratches on the bonding surfaces are removed in advance and thus the bonding surfaces are made to be smooth.

(Heat Sink-Preparing Process S04)

Next, the heat sink 31 to be bonded is prepared. At this time, as illustrated in FIG. 5, the chill layer 35A, in which a Si phase of which an aspect ratio of a crystal grain is 2.5 or less and a crystal grain diameter is 15 μm or less is dispersed, is formed on a bonding surface side with the metal layer 13 (Cu layer 13B) in the heat sink 31, and the thickness of the chill layer 35A is set to 80 μm or greater. The thickness of the chill layer 35A is preferably 100 μm or greater, and more preferably 200 μm or greater, but there is no limitation to the ranges.

Here, during casting of the heat sink 31, it is possible to control the thickness of the chill layer 35A by adjusting a cooling rate at least in the vicinity of the bonding surface of the heat sink 31. In this case, for example, a temperature of a mold during the casting may be set to 230° C. or lower, and preferably 210° C. or lower. The temperature of the mold during the casting may be set to 140° C. or higher, and preferably 160° C. or higher.

In addition, as conditions during casting of the heat sink, for example, an injection pressure may be set to 400 kgf/cm$^2$ to 600 kg/cm$^2$, a molten metal temperature may be set to 650° C. to 750° C., an injection speed may be set to 30 m/s to 60 m/s, and a sleeve-filling rate may be set to 40% to 60%. Examples of an atmosphere include an inert atmosphere such as nitrogen and argon, an oxygen atmosphere, a vacuum atmosphere, and the like.

In addition, the thickness of the chill layer 35A can be controlled by adjusting a grinding amount of a surface after casting.

(Metal Layer/Heat Sink-Bonding Process S05)

Next, the metal layer 13 (Cu layer 13B) and the heat sink 31 are laminated, and the resultant laminated body is disposed in a vacuum heating furnace and is heated therein in a pressurized state (pressure is set to 5 to 35 kgf/cm$^2$ (0.49 to 3.43 MPa)) in a laminating direction to subject the metal layer 13 (Cu layer 13B) and the heat sink 31 to solid-phase diffusion bonding. Furthermore, in respective bonding surfaces, which are subjected to the solid-phase diffusion bonding, of the metal layer 13 (Cu layer 13B) and the heat sink 31, scratches on the bonding surface are removed in advance and thus the bonding surfaces are made to be smooth. A pressure during the pressurization is preferably set to 8 to 20 kgf/cm$^2$ (0.78 to 1.96 MPa), but there is no limitation to this range.

Here, it is preferable that a pressure inside the vacuum heating furnace be set in a range of 10$^{-6}$ Pa to 10$^{-3}$ Pa, a heating temperature be set in a range of 400° C. to 520° C., and retention time be set in a range of 0.25 hours to 3 hours. It is more preferable that the pressure inside the vacuum heating furnace be set in a range of 10$^{-5}$ Pa to 10$^{-4}$ Pa, the heating temperature be set in a range of 480° C. to 510° C., and the retention time be set in a range of 0.5 hours to 2 hours. However, there is no limitation to the ranges.

In the metal layer/heat sink-bonding process S05, Cu atoms in the Cu layer 13B diffuse to the chill layer 35A side of the heat sink 31, and thus the intermetallic compound layer 38 and the chill layer 35 are formed as illustrated in FIG. 2.

In this manner, the power module substrate with heat sink 30 according to this embodiment is manufactured.

(Die-Bonding Process S06)

Next, the semiconductor element 3 is laminated on one surface (front surface (upper side in FIG. 1)) of the circuit layer 12 through a solder material 2, and the resultant laminated body is subjected to solder bonding in a reducing furnace.

As described above, the power module 1 according to this embodiment is manufactured.

According to the power module substrate with heat sink 30 according to this embodiment which is configured as described, the heat sink 31 is constituted by an aluminum alloy of which a solidus temperature is lower than a eutectic temperature (548° C.) of Al and Cu that constitutes the bonding surface (Cu layer 13B) of the metal layer 13. Specifically, the heat sink 31 is constituted by a casted material of ADC12 (solidus temperature: 515° C.), which is a die-casting aluminum alloy defined in JIS H 2118:2006. Accordingly, it is possible to constitute the heat sink 31 with a complicated structure including the flow passage 32, and thus it is possible to improve a heat dissipation performance.

In addition, in this embodiment, the chill layer 35, in which a Si phase of which an aspect ratio (major axis/minor axis) of a crystal grain is 2.5 or less and a crystal grain diameter is 15 μm or less is dispersed, is formed on the bonding interface side with the metal layer 13 (Cu layer 13B) in the heat sink 31, and the thickness of the chill layer 35 is set to 50 μm or greater. Accordingly, it is possible to obstruct diffusion migration of Cu atoms of the metal layer 13 (Cu layer 13B) due to the chill layer 35, and thus it is possible to suppress occurrence of a Kirkendall void. According to this, even in a case where the power module substrate with heat sink 30 is maintained at a high temperature, heat resistance in the laminating direction does not increase, and thus it is possible to suppress deterioration of heat dissipation characteristics.

In addition, in this embodiment, the intermetallic compound layer 38, which is constituted by an intermetallic compound layer of Cu and Al, is formed at the bonding interface between the metal layer 13 (Cu layer 13B) and the heat sink 31. The intermetallic compound layer 38 has a structure in which a plurality of the intermetallic compounds are laminated along the bonding interface, and thus it is possible to suppress great growth of the intermetallic compounds which are brittle. In addition, a volume variation at the inside of the intermetallic compound layer 38 decreases, and thus an internal strain is suppressed.

In addition, in this embodiment, at the bonding interface between the Cu layer 13B and the intermetallic compound layer 38, oxides are dispersed in a layer shape along the bonding interface. Accordingly, an oxide film formed on the bonding surface of the heat sink 31 is reliably broken, and mutual diffusion of Cu and Al sufficiently progresses, and thus the Cu layer 13B and the heat sink 31 are reliably bonded to each other.

In addition, according to the method of manufacturing the power module substrate with heat sink 30 according to this embodiment, in the heat sink 31 before bonding which is prepared in the heat sink-preparing process S04, the chill layer 35A, in which a Si phase of which an aspect ratio of a crystal grain is 2.5 or less and a crystal grain diameter is 15 μm or less is dispersed, is formed on the bonding surface side with the metal layer 13 (Cu layer 13B) in the heat sink 31, and the thickness of the chill layer 35A is set to 80 μm or greater. Accordingly, in the metal layer/heat sink-bonding process S05, when the heat sink 31 and the metal layer 13 (Cu layer 13B) are subjected to the solid-phase diffusion bonding, it is possible to suppress diffusion migration of Cu atoms of the Cu layer 13B more than necessary, and thus it is possible to suppress occurrence of the Kirkendall void.

Accordingly, it is possible to manufacture the power module substrate with heat sink 30 in which heat resistance in the laminating direction is low and heat dissipation characteristics are excellent.

In addition, in a case where scratches exist on the bonding surface during the solid-phase diffusion bonding, there is a concern that a gap may occur in the bonding interface. However, in this embodiment, bonding surfaces of the Cu layer 13B (copper plate 23B) and the heat sink 31 are made to be flat by removing scratches on the bonding surface, and are subjected to the solid-diffusion bonding, and thus it is possible to suppress occurrence of a gap in the bonding interface. As a result, it is possible to reliably perform the solid-phase diffusion bonding.

Furthermore, typically, during grinding of the surface of the heat sink 31 that is constituted by a casted material, a chill layer, which is formed in a surface layer in a small thickness, is removed. However, in this embodiment, the chill layer is formed in a large thickness during casting, and thus the chill layer remains after the surface grinding.

In this embodiment, the upper limit of the thickness of the chill layer is not particularly limited, and in a case of using the heat sink 31 constituted by a casted material, it is preferable to set the upper limit to 5000 μm or less. In a case of manufacturing the heat sink 31 through casting, it is difficult to manufacture the heat sink 31 in which the thickness of the chill layer is greater than 5000 μm.

In addition, in a case where the heat sink 31 is thin, the entirety of the heat sink 31 may be the chill layer. Even in this case, the same operational effect as in this embodiment can be exhibited.

Second Embodiment

Figure 6:
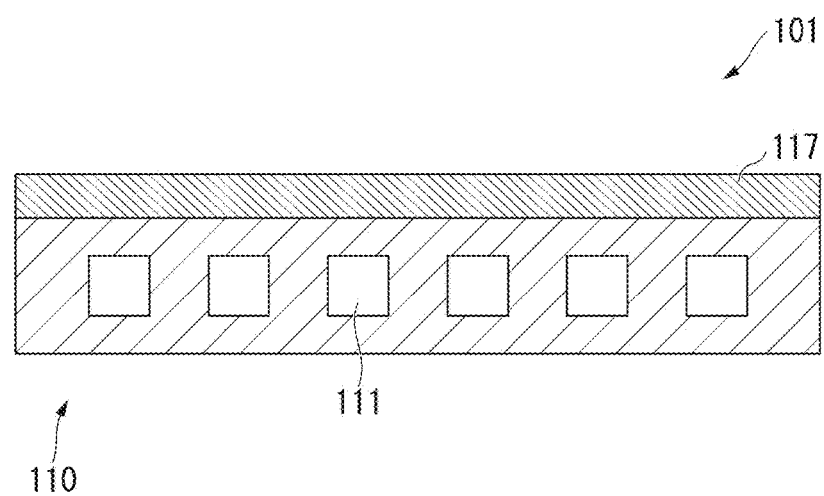
FIG. 6 is a schematic view illustrating a heat sink according to a second embodiment of the invention.

Next, description will be given of a heat sink according to a second embodiment of the invention. FIG. 6 illustrates a heat sink 101 according to the second embodiment of the invention.

Figure 9:
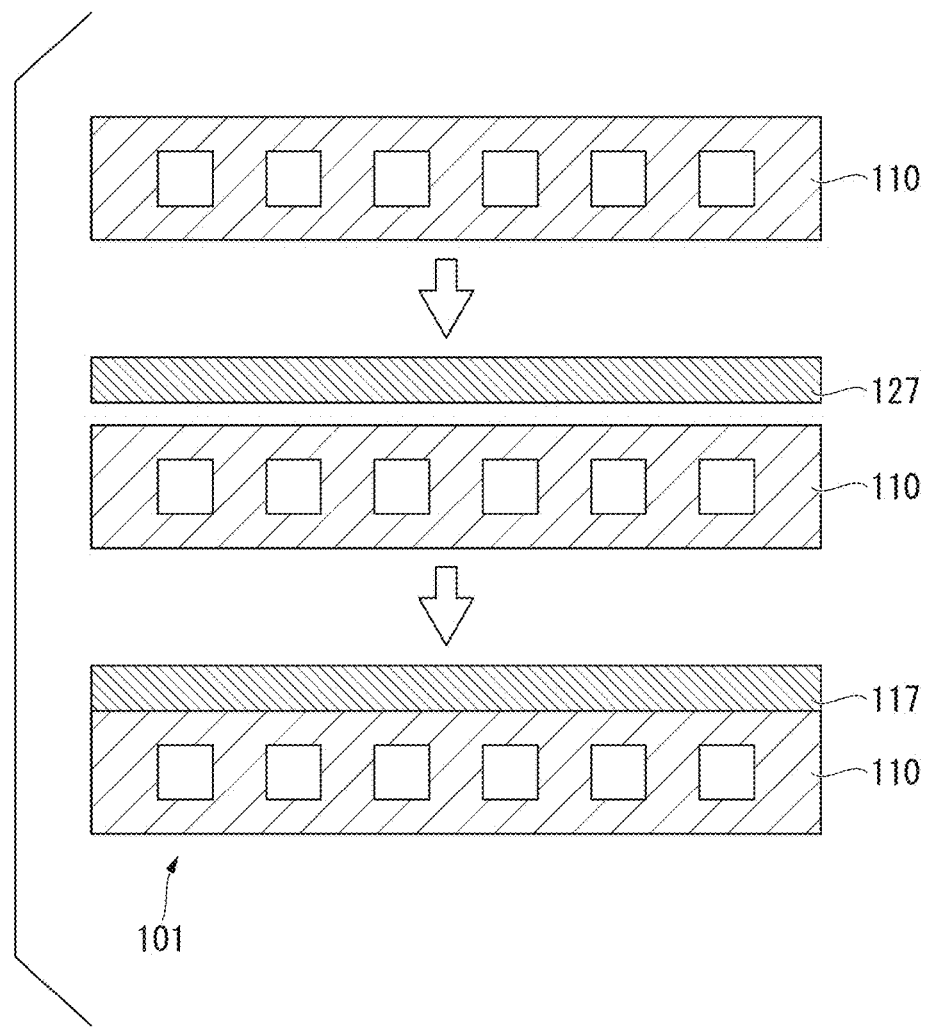
FIG. 9 is a schematic view illustrating the method of manufacturing the heat sink according to the second embodiment.

The heat sink 101 includes a heat sink main body 110, and a metal member layer 117 that is laminated on one surface (upper side in FIG. 6) of the heat sink main body 110 and is formed from copper, nickel, or silver. In this embodiment, as illustrated in FIG. 9, the metal member layer 117 is constructed through bonding of a metal plate 127 that is constituted by a rolled plate of oxygen-free copper.

The heat sink main body 110 is provided with a flow passage 111 through which a cooling medium flows. The heat sink main body 110 is constituted by an aluminum alloy having a solidus temperature that is lower than a eutectic temperature (548° C.) of Al and a metal element (Cu in this embodiment) that constitutes the metal member layer 117. Specifically, the heat sink main body 110 is constituted by a casted material of ADC14 (solidus temperature: 507° C.), which is a Si-containing die-casting aluminum alloy defined in JIS H 2118:2006. Furthermore, ADC14 is an aluminum alloy that contains Si in a range of 16 mass % to 18 mass %, and Mg in a range of 0.45 mass % to 0.65 mass %. In the aluminum alloy, the amount of Si is preferably 1 mass % to 25 mass %, but there is no limitation thereto.

Figure 7:
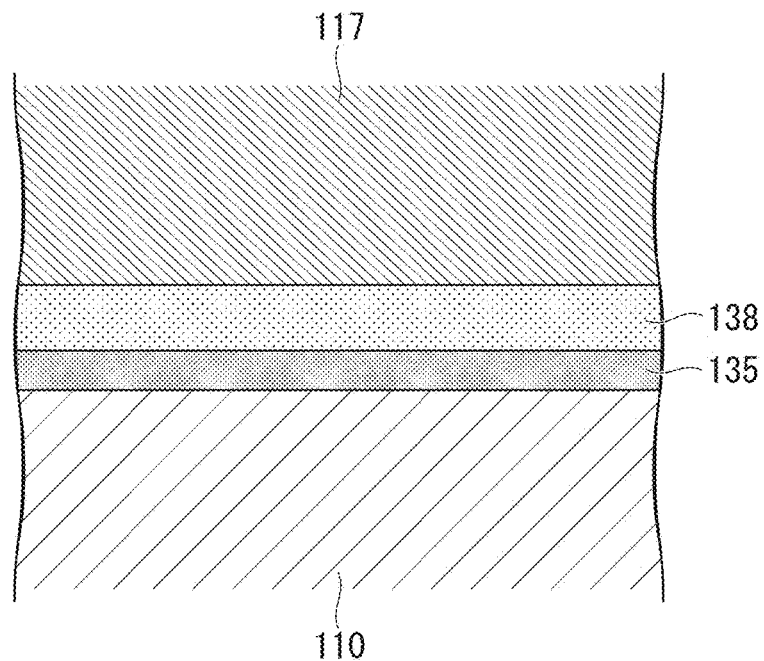
FIG. 7 is an enlarged cross-sectional view illustrating a bonding interface between a heat sink main body and a metal member layer of the heat sink illustrated in FIG. 6.

In addition, as illustrated in FIG. 7, a chill layer 135 in which a Si phase of which an aspect ratio (major axis/minor axis) of a crystal grain is 2.5 or less and a crystal grain diameter is 15 μm or less is dispersed, is formed on a bonding interface side with the metal member layer 117 in the heat sink main body 110. The aspect ratio (major axis/minor axis) of a crystal grain of the Si phase is preferably 1.0 to 2.0, and more preferably 1.0 to 1.5. The crystal grain diameter is preferably 0.5 μm to 10 μm, and more preferably 1 μm to 7 μm. However, there is no limitation to the ranges.

The chill layer 135 is formed in the vicinity of a surface layer portion of a casted material (portion in the vicinity of a casting mold) when forming the casted material that constitutes the heat sink main body 110. In the chill layer 135, the crystal grain diameter is finer and the aspect ratio is smaller in comparison to the inside of the casted material.

The thickness of the chill layer 135 is set to 50 μm or greater. The thickness of the chill layer 135 is preferably 100 μm or greater, and more preferably 200 μm or greater, but there is no limitation to the ranges.

Here, the heat sink main body 110 and the metal member layer 117 are subjected to the solid-phase diffusion bonding.

As illustrated in FIG. 7, an intermetallic compound layer 138 is formed at a bonding interface between the heat sink main body 110 and the metal member layer 117. The intermetallic compound layer 138 is formed through mutual diffusion of Al atoms of the heat sink main body 110 and Cu atoms of the metal member layer 117. The intermetallic compound layer 138 has a concentration gradient in which the concentration of Al atoms further decreases and the concentration of Cu atoms further increases as it goes toward the metal member layer 117 from the heat sink main body 110.

The intermetallic compound layer 138 is constituted by an intermetallic compound composed of Cu and Al. In this embodiment, the intermetallic compound layer 138 has a structure in which a plurality of the intermetallic compounds are laminated along the bonding interface. Here, the thickness of the intermetallic compound layer 138 is set in a range of 1 μm to 80 μm, and preferably in a range of 5 μm to 80 μm.

Furthermore, the intermetallic compound layer 138 is formed when Cu in the metal member layer 117 diffuses to the heat sink main body 110 (chill layer 135) side, and Mg particles contained in the heat sink main body 110 may be dispersed in the intermetallic compound layer 138.

In this embodiment, the intermetallic compound layer 138 has a structure in which three kinds of intermetallic compounds are laminated. In the order from the heat sink main body 110 side toward the metal member layer 117 side, a θ-phase and a $\eta_2$-phase are laminated along the bonding interface between the heat sink main body 110 and the metal member layer 117, and at least one phase among a $\zeta_2$-phase, a δ-phase, and a $\gamma_2$-phase is laminated.

In addition, at the bonding interface between the intermetallic compound layer 138 and the metal member layer 117, oxides are dispersed in a layer shape along the bonding interface. Furthermore, in this embodiment, the oxides are composed of aluminum oxides such as alumina ($Al_2O_3$). Furthermore, the oxides are dispersed at the interface between the intermetallic compound layer 138 and the metal member layer 117 in a disconnected state, and a region in which the intermetallic compound layer 138 and the metal member layer 117 are in direct contact with each other also exists. In addition, the oxides may be dispersed at the inside of the θ-phase, the $\eta_2$-phase, or at least one phase among the $\zeta_2$-phase, the δ-phase, and the $\gamma_2$-phase in a layer shape.

Figure 8:
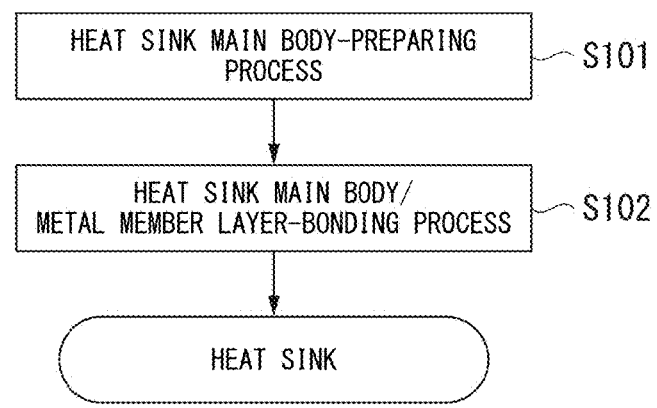
FIG. 8 is a flowchart illustrating a method of manufacturing the heat sink according to the second embodiment.

Next, description will be given of a method of manufacturing the heat sink 101 according to this embodiment with reference to FIG. 8 and FIG. 9.

(Heat Sink Main Body-Preparing Process S101)

First, the heat sink main body 110 to be bonded is prepared. At this time, as is the case with the heat sink 31 (refer to FIG. 5) described in the first embodiment, the chill layer, in which a Si phase of which an aspect ratio of a crystal grain is 2.5 or less and a crystal grain diameter is 15 μm or less is dispersed, is formed on a bonding surface side with the metal member layer 117 in the heat sink main body 110, and the thickness of the chill layer is set to 80 μm or greater. The thickness of the chill layer is preferably 100 μm or greater, and more preferably 200 µm or greater, but there is no limitation to the ranges.

Here, during casting of the heat sink main body 110, it is possible to control the thickness of the chill layer by adjusting a cooling rate at least in the vicinity of the bonding surface of the heat sink main body 110. In this case, for example, a temperature of a mold during the casting may be set to 230° C. or lower, and preferably 210° C. or lower. The temperature of the mold during the casting may be set to 140° C. or higher, and preferably 160° C. or higher. In addition, as conditions during casting of the heat sink main body 110, for example, an injection pressure may be set to 400 kgf/cm$^2$ to 600 kgf/cm$^2$, a molten metal temperature may be set to 650° C. to 750° C., an injection speed may be set to 30 m/s to 60 m/s, and a sleeve-filling rate may be set to 40% to 60%. Examples of an atmosphere include an inert atmosphere such as nitrogen and argon, an oxygen atmosphere, a vacuum atmosphere, and the like.

In addition, the thickness of the chill layer can be controlled by adjusting a grinding amount of a surface after casting.

(Heat Sink Main Body/Metal Member Layer-Bonding Process S102)

Next, as illustrated in FIG. 9, the heat sink main body 110 and the metal plate 127 that becomes the metal member layer 117 are laminated, and the resultant laminated body is disposed in a vacuum heating furnace and is heated therein in a pressurized state (pressure is set to 1 to 35 kgf/cm$^2$ (0.10 to 3.43 MPa)) in a laminating direction to subject the metal plate 127 and the heat sink main body 110 to solid-phase diffusion bonding. Furthermore, in respective bonding surfaces, which are subjected to the solid-phase diffusion bonding, of the metal plate 127 and the heat sink main body 110, scratches on the bonding surface are removed in advance and thus the bonding surfaces are made to be smooth. A pressure during the pressurization is preferably set to 8 to 20 kgf/cm$^2$ (0.78 to 1.96 MPa), but there is no limitation to this range.

Here, it is preferable that a pressure inside the vacuum heating furnace be set in a range of $10^{-6}$ Pa to $10^{-3}$ Pa, a heating temperature be set in a range of 400° C. to 520° C., and retention time be set in a range of 0.25 hours to 3 hours. It is more preferable that the pressure inside the vacuum heating furnace be set in a range of $10^{-5}$ Pa to $10^{-4}$ Pa, the heating temperature be set in a range of 480° C. to 510° C., and the retention time be set in a range of 0.5 hours to 2 hours. However, there is no limitation to the ranges.

In the heat sink main body/metal member layer-bonding process S102, Cu atoms in the metal plate 127 diffuse to the chill layer side of the heat sink main body 110, and thus the intermetallic compound layer 138 and the chill layer 135 are formed as illustrated in FIG. 7.

In this manner, the heat sink 101 according to this embodiment is manufactured.

According to the heat sink 101 according to this embodiment which is configured as described above, the metal member layer 117 is formed by bonding the metal plate 127 constituted by a rolled plate of oxygen-free copper on one surface side of the heat sink main body 110, and thus it is possible to make heat spread in a plane direction by the metal member layer 117, and thus it is possible to greatly improve heat dissipation characteristics. In addition, it is possible to bond another member and the heat sink 101 by using solder and the like in a satisfactory manner.

In addition, the heat sink main body 110 is constituted by an aluminum alloy having the solidus temperature that is lower than the eutectic temperature (548° C.) of Al and the metal element (Cu) that constitutes the metal member layer 117. Specifically, the heat sink main body 110 is constituted by a casted material of ADC14 (solidus temperature: 507° C.), which is a die-casting aluminum alloy defined in JIS H 2118:2006. Accordingly, it is possible to construct the heat sink main body 110 with a complicated structure including a flow passage and the like.

In addition, in this embodiment, the chill layer 135, in which a Si phase of which an aspect ratio (major axis/minor axis) of a crystal grain is 2.5 or less and a crystal grain diameter is 15 µm or less is dispersed, is formed on a bonding interface side with the metal member layer 117 in the heat sink main body 110, and the thickness of the chill layer 135 is set to 50 µm or greater. Accordingly, it is possible to obstruct diffusion migration of Cu atoms of the metal member layer 117 due to the chill layer 135, and thus it is possible to suppress occurrence of the Kirkendall void. According to this, even in a case where the heat sink 101 is maintained at a high temperature, heat resistance in the laminating direction does not increase, and thus it is possible to suppress deterioration of heat dissipation characteristics.

In addition, in this embodiment, the bonding interface between the metal member layer 117 and the heat sink main body 110 has the same configuration as the bonding interface between the Cu layer 13B and the heat sink 31 in the first embodiment, and thus it is possible to exhibit the same operational effect as in the first embodiment.

In this embodiment, the upper limit of the thickness of the chill layer is not particularly limited, and in a case of using the heat sink main body 110 constituted by a casted material, it is preferable to set the upper limit to 5000 µm or less. In a case of manufacturing the heat sink main body 110 through casting, it is difficult to manufacture the heat sink main body 110 in which the thickness of the chill layer is greater than 5000 µm.

In addition, in a case where the heat sink main body 110 is thin, the entirety of the heat sink main body 110 may be the chill layer. Even in this case, the same operational effect as in this embodiment can be exhibited.

Hereinbefore, description has been given of the embodiments of the invention. However, the invention is not limited thereto, and modifications can be appropriately made in a range not departing from the technical spirit of the invention.

For example, in the embodiments, description has been given of a case where the Cu layer formed from copper as the metal member layer is subjected to bonding. However, a Ni layer formed from nickel or a nickel alloy or a Ag layer formed from silver or a silver alloy may be subjected to the bonding instead of the Cu layer.

In a case of forming the Ni layer instead of the Cu layer, solderability becomes satisfactory, and thus it is possible to improve bonding reliability with another member. In addition, in a case of forming the Ni layer through the solid-phase diffusion bonding, it is not necessary to perform a masking treatment that is performed when forming a Ni plating film through electroless plating and the like, and thus it is possible to reduce the manufacturing cost. In this case, it is preferable that the thickness of the Ni layer be set to 1 µm to 30 µm. In a case where the thickness of the Ni layer is less than 1 µm, there is a concern that the effect of improving the bonding reliability with another member may disappear, and in a case where the thickness is greater than 30 µm, there is a concern that the Ni layer becomes a heat resistant body and thus it is difficult to efficiently transfer heat. In addition, in a case of forming the Ni layer through the solid-phase diffusion bonding, with regard to solid-phase diffusion bonding between an Al layer and Ni, a bonding temperature is set to 400° C. to 520° C., but the other conditions can be set to the same conditions as in the above-described embodiments.

In a case of forming the Ag layer instead of the Cu layer, for example, when bonding the Ag layer with another member by using a silver oxide paste including silver oxide particles and a reducing agent composed of an organic material, bonding between silver after a silver oxide of the silver oxide paste is reduced by the reducing agent, and the Ag layer is bonded between the same kinds of metals, and thus it is possible to improve the bonding reliability. In addition, the Ag layer having satisfactory heat conductivity is formed, and thus it is possible to efficiently and widely transfer heat in an in-plane direction. In this case, it is preferable that the thickness of the Ag layer be set to 1 mm to 20 μm. In a case where the thickness of the Ag layer is less than 1 μm, there is a concern that the effect of improving the bonding reliability with another member may disappear, and in a case where the thickness is greater than 20 μm, there is a concern that the effect of improving the bonding reliability is not obtained and an increase in the cost is caused. In addition, in a case of forming the Ag layer through the solid-phase diffusion bonding, as a solid-phase diffusion bonding condition between an Al layer and Ag, a bonding temperature is set to 400° C. to 520° C., but the other conditions can be set to the same conditions as in the above-described embodiments.

Figure 10:
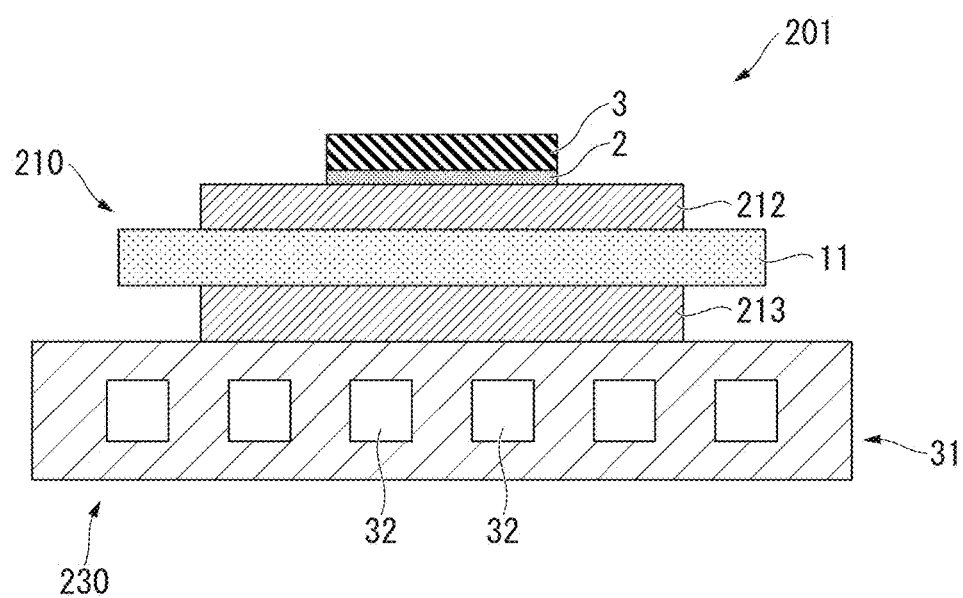
FIG. 10 is a schematic view illustrating a power module including a power module substrate with heat sink according to another embodiment of the invention.

In addition, in the first embodiment, description has been given of a configuration in which the metal layer 13 includes the Al layer 13A and the Cu layer 13B, but there is no limitation thereto. As illustrated in FIG. 10, the entirety of the metal layer may be constituted by copper or a copper alloy. In a power module substrate with heat sink 230 illustrated in FIG. 10, a copper plate is bonded to a surface on the other side (lower side in FIG. 10) of the ceramic substrate 11 in accordance with a DBC method, an active metal brazing method, and the like, and a metal layer 213 formed from copper or a copper alloy is formed. In addition, the metal layer 213 and the heat sink 31 are subjected to the solid-phase diffusion bonding. Furthermore, in the power module substrate 210 illustrated in FIG. 10, a circuit layer 212 is also constituted by copper or a copper alloy. A power module 201 illustrated in FIG. 10 includes the power module substrate with heat sink 230, and a semiconductor element 3 that is bonded to one surface (upper surface in FIG. 10) of the power module substrate with heat sink 230 through a solder layer 2.

In the first embodiment, description has been given of a configuration in which the circuit layer is formed through bonding of an aluminum plate having the purity of 99 mass %, but there is no limitation thereto. The circuit layer may be constituted by other metals such as pure aluminum having the purity of 99.99 mass % or greater, another aluminum or an aluminum alloy, and copper or a copper alloy. In addition, the circuit layer may be set to have a two-layer structure of an Al layer and a Cu layer. This is also true of the power module substrate 210 illustrated in FIG. 10.

In the metal layer/heat sink-bonding process S05 according to the first embodiment, description has been given of a configuration in which the metal layer 13 (Cu layer 13B) and the heat sink 31 are laminated, and the resultant laminated body is disposed in a vacuum heating furnace and is heated therein in a pressurized state in a laminating direction. In addition, in the heat sink main body/metal member layer-bonding process S102 according to the second embodiment, description has been given of a configuration in which the heat sink main body 110 and the metal plate 127 that becomes the metal member layer 117 are laminated, and the resultant laminated body is disposed in a vacuum heating furnace and is heated therein in a pressurized state (pressure of 5 to 35 kgf/cm$^2$) (0.49 to 3.43 MPa)) in a laminating direction. However, there is no limitation to the above-described configurations, and as illustrated in FIG. 11, an electrical heating method may be applied when subjecting an aluminum alloy member 301 (the heat sink 31 or the heat sink main body 110), and a metal member 302 (the metal layer 13 or the metal member layer 117) to the solid-phase diffusion bonding.

Figure 11:
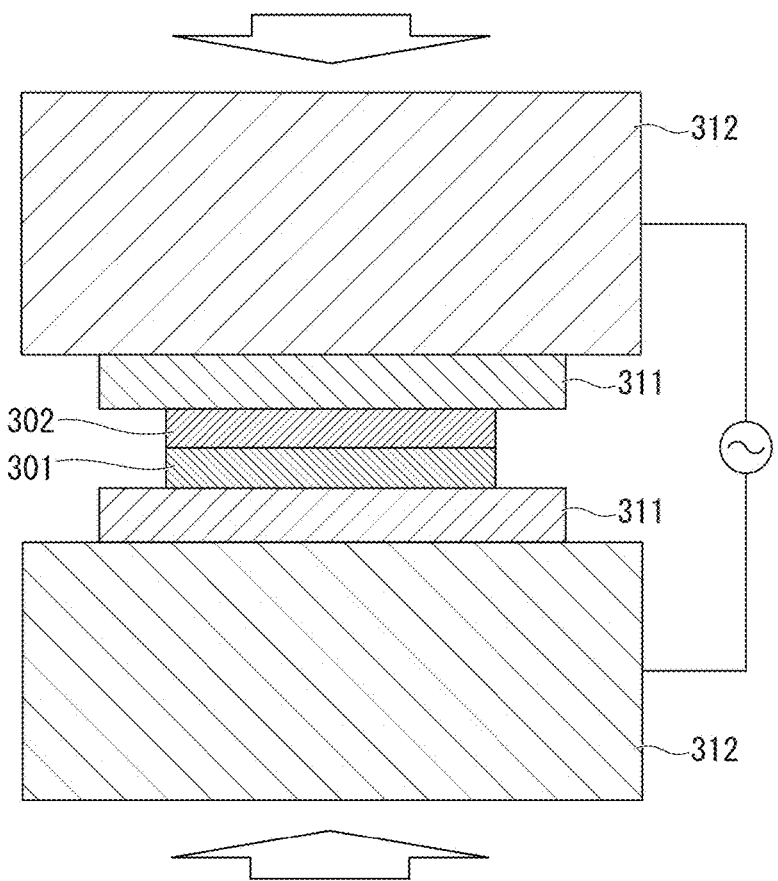
FIG. 11 is a schematic view illustrating a situation in which solid-phase diffusion bonding is performed by an electrical heating method.

In a case of performing the electrical heating, as illustrated in FIG. 11, the aluminum alloy member 301 and the metal member 302 are laminated, and the resultant laminated body is pressurized in a laminating direction by a pair of electrodes 312 and 312 through carbon plates 311 and 311, and electrification is performed with respect to the aluminum alloy member 301 and the metal member 302. In this case, the carbon plates 311 and 311, the aluminum alloy member 301, and the metal member 302 are heated by Joule's heat, and thus the aluminum alloy member 301 and the metal member 302 are subjected to the solid-phase diffusion bonding.

In the above-described electrical heating method, the aluminum alloy member 301 and the metal member 302 are directly electrically heated. Accordingly, for example, it is possible to make a temperature rising rate be as relatively fast as 30 to 100° C./min, and thus it is possible to perform the solid-phase diffusion bonding in a short time. As a result, an influence of oxidation on a bonding surface is small, and thus it is also possible to perform bonding, for example, in an atmospheric atmosphere. In addition, in accordance with a resistance value or specific heat of the aluminum alloy member 301 and the metal member 302, it is possible to bond the aluminum alloy member 301 and the metal member 302 in a state in which a temperature difference occurs therebetween, and thus a difference in thermal expansion decreases. As a result, it is possible to realize a reduction in thermal stress.

Here, in the above-described electrical heating method, it is preferable that a pressurizing load applied by the pair of electrodes 312 and 312 be set in a range of 30 kgf/cm$^2$ to 100 kgf/cm$^2$ (2.94 MPa to 9.81 MPa). The pressurizing load is more preferably set in a range of 50 kgf/cm$^2$ to 80 kgf/cm$^2$ (4.90 MPa to 7.85 MPa), but there is no limitation to the ranges.

In addition, in a case of applying the electrical heating method, with regard to surface roughness of the aluminum alloy member 301 and the metal member 302, it is preferable that arithmetic average roughness Ra be set to 0.3 μm to 0.6 μm, and the maximum height Rz be set in a range of 1.3 μm to 2.3 μm. In typical solid-phase diffusion bonding, it is preferable that the surface roughness of the bonding surface be small. However, in a case of the electrical heating method, when the surface roughness of the bonding surface is too small, interface contact resistance decreases, and thus it is difficult to locally heat the bonding interface. Accordingly, the surface roughness is preferably set in the above-described range.

Furthermore, the above-described electrical heating method can be used in the metal layer/heat sink-bonding process S05 according to the first embodiment. In this case, since the ceramic substrate 11 is an insulator, thus it is necessary to short-circuit the carbon plates 311 and 311, for example, with a jig formed from carbon, and the like.

Bonding conditions are the same as those in the bonding between the aluminum member 301 and the copper member 302.

In addition, surface roughness of the metal layer 13 (Cu layer 13B) and the heat sink 31 is the same as in the case of the aluminum member 301 and the copper member 302.

EXAMPLES

Hereinafter, description will be given of results of a confirmation experiment that is performed to confirm the effect of the invention.

(Preparation of Test Piece)

One surface of an aluminum alloy plate (50 mm×50 mm, thickness: 5 mm) illustrated in Table 1 was ground until reaching the thickness of a chill layer in Table 1, and a metal plate (40 mm×40 mm, thickness illustrated in Table 1) illustrated in Table 1 was solid-phase diffusion-bonded to the surface in accordance with the method described in the embodiments.

In Examples 1 to 5, and Comparative Examples 1 to 3, the aluminum alloy plate and the metal plate were subjected to solid-phase diffusion bonding under conditions of 500° C. and 180 minutes with a vacuum heating furnace while being pressurized in a laminating direction with a load of 15 kgf/cm$^2$ (1.47 MPa).

In Examples 6 to 10, the aluminum alloy plate and the metal plate were subjected to the solid-phase diffusion bonding in accordance with the electrical heating method illustrated in FIG. 11. Furthermore, a pressurizing load with the electrodes was set to 15 kgf/cm$^2$ (1.47 MPa), a heating temperature (copper plate temperature) was set to 510° C., retention time at the heating temperature was set to 5 minutes, and a temperature rising rate was set to 80° C./minute. In addition, a bonding atmosphere was set to an atmospheric atmosphere.

(Thickness of Chill Layer in Aluminum Alloy Plate before Bonding)

The aluminum plate was observed before bonding, and the thickness of the chill layer formed on the bonding surface side was measured as follows.

Figure 12:
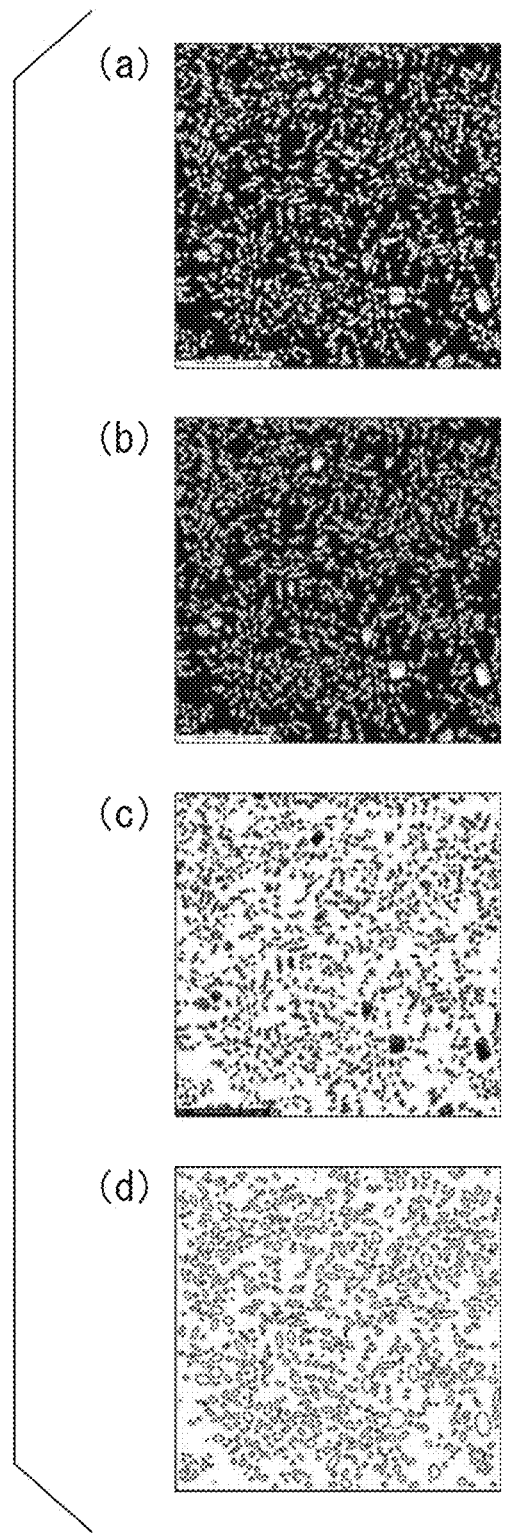
FIG. 12 is a view illustrating a procedure of extracting a contour of a Si phase in examples.

First, surface analysis of Si was performed with respect to the surface of the aluminum plate by using EPMA (JXA-8530F, manufactured by JEOL Ltd.) under conditions of a visual field of 360 μm square, an acceleration voltage of 15 kV, and a Si contour level of 0 to 1000, thereby obtaining a Si distribution image illustrated in FIG. 12(a).

The Si distribution image obtained was converted into an 8-bit gray scale, thereby obtaining a Si distribution image illustrated in FIG. 12(b).

Next, the Si distribution image was binarized as illustrated in FIG. 12(c) on the basis of Kapur-Sahoo-Wong (Maximum Entropy) thresholding method (Kapur, J N; Sahoo, P K; Wong, A C K (1985), "A New Method for Gray-level Picture Thresholding Using the Entropy of the Histogram", Graphical Models and Image Processing 29(3): refer to 273-285).

Next, as illustrated in FIG. 12(d), the contour of the Si phase was extracted from the binarized image through elliptic approximation.

An aspect ratio and a crystal grain diameter were calculated from the following expression by using a major axis and a minor axis which were obtained from the elliptic approximation on the basis of the image from which the contour of the Si phase was extracted.

Aspect ratio=major axis/minor axis

Crystal grain diameter=major axis

In addition, in an area of 360 μm$^2$, the number of particles satisfying conditions in which the aspect ratio is 2.5 or less and the crystal grain diameter is 15 μm or less (hereinafter, simply referred to as "conditions") and the number of particles not satisfying were obtained to obtain a ratio of the number of particles satisfying the conditions/the number of particles not satisfying the condition.

Measurement was performed for every 10 μm from a surface of the aluminum plate toward the inside of the plate in accordance with the measurement method, and a portion in which the ratio of the number of particles satisfying the conditions/the number of particles not satisfying the conditions is three or greater was defined as a chill layer, and the thickness of the chill layer was obtained.

Evaluation results are illustrated in Table 1.

(Thickness of Chill Layer at Bonding Interface Between Aluminum Alloy Plate and Metal Plate After Bonding)

A cross-sectional observation of a bonded body of the aluminum alloy plate and the metal plate, which were subjected to the solid-phase diffusion bonding, was performed and the thickness of the chill layer formed at the bonding interface was measured as follows.

The bonding interface of the bonded body was observed by using EPMA (JXA-8530F, manufactured by JEOL Ltd.) to obtain the thickness of an intermetallic compound of Al that grows to the inside of the aluminum alloy plate and a metal element (Cu, Ni, Ag) of the metal plate. A thickness, which was obtained by subtracting the thickness of the intermetallic compound of Al and the metal element (Cu, Ni, Ag) of the metal plate from the thickness of the chill layer before bonding, was set as the thickness of the chill layer after bonding.

Furthermore, the thickness of the intermetallic compound was measured as follows. Line analysis of the bonding interface was performed in a thickness direction of the bonded body. A region in which the concentration of Al was 65 at % to 70 at % was regarded as the intermetallic compound in a case of using copper as the metal plate, a region in which the concentration of Al was 55 at % to 80 at % was regarded as the intermetallic compound in a case of using nickel as the metal plate, and a region in which the concentration of Al was 20 at % to 45 at % was regarded as the intermetallic compound in a case of using silver as the metal plate. Then, the thickness of the region was measured as the thickness of the intermetallic compound.

Evaluation results are illustrated in Table 1.

(Heat Cycle Test)

Next, a heat cycle test was performed with respect to the bonded body that was manufactured as described above. The heat cycle for 5 minutes at −40° C. and for 5 minutes at 150° C. was applied to the test piece (power module with heat sink) 4000 times by using a thermal impact tester (TSB-51, manufactured by ESPEC CORP.) in a liquid phase (Fluorinert).

In addition, heat resistance in the laminating direction of the bonded body before the heat cycle test, and heat resistance in the laminating direction of the bonded body after the heat cycle test were evaluated as follows.

(Measurement of Heat Resistance)

A heater chip (13 mm×10 mm×0.25 mm) was soldered to a surface of the metal plate, and the aluminum alloy plate was brazed to a cooling device. Next, the heater chip was heated at power of 100 W, and a temperature of the heater chip was measured by using a thermocouple. In addition, a temperature of a cooling medium (ethylene glycol:water=9:1), which flows through the cooling device, was measured. In addition, a value obtained by dividing a difference between the temperature of the heater chip and the temperature of the cooling medium by electric power was set as heat resistance.

Furthermore, heat resistance in Comparative Example 1, in which the aluminum alloy plate and the copper plate were subjected to the solid-phase diffusion bonding without forming the chill layer, before the heat cycle was set to "1" as a reference, and the heat resistance was evaluated as a ratio with Comparative Example 1. Evaluation results are illustrated in Table 1.

TABLE 1

| | Metal plate | | Aluminum alloy plate | | Thickness of chill layer | | Heat resistance | |
|---|---|---|---|---|---|---|---|---|
| | Material | Thickness (μm) | Material | Solidus temperature (° C.) | Before bonding (μm) | After bonding (μm) | Before heat cycle | After heat cycle |
| Example 1 | Oxygen-free copper | 1500 | AC4B | 520 | 550 | 530 | 0.940 | 0.959 |
| Example 2 | Oxygen-free copper | 1500 | AC9A | 520 | 1000 | 980 | 0.865 | 0.880 |
| Example 3 | Oxygen-free copper | 1500 | ADC12 | 515 | 80 | 50 | 0.974 | 0.992 |
| Example 4 | Nickel | 30 | ADC12 | 515 | 500 | 480 | 1.393 | 1.421 |
| Example 5 | Silver | 20 | ADC12 | 515 | 300 | 290 | 1.386 | 1.409 |
| Example 6 | Oxygen-free copper | 1500 | AC4B | 520 | 550 | 540 | 0.927 | 0.938 |
| Example 7 | Oxygen-free copper | 1500 | AC9A | 520 | 1000 | 985 | 0.850 | 0.860 |
| Example 8 | Oxygen-free copper | 1500 | ADC12 | 515 | 80 | 65 | 0.957 | 0.975 |
| Example 9 | Nickel | 30 | ADC12 | 515 | 500 | 490 | 1.368 | 1.391 |
| Example 10 | Silver | 20 | ADC12 | 515 | 300 | 295 | 1.372 | 1.394 |
| Comparative Example 1 | Oxygen-free copper | 1500 | ADC12 | 515 | 0 | 0 | 1.000 | 1.044 |
| Comparative Example 2 | Nickel | 30 | ADC12 | 515 | 0 | 0 | 1.453 | 1.498 |
| Comparative Example 3 | Silver | 20 | ADC12 | 515 | 0 | 0 | 1.434 | 1.480 |

In Comparative Example 1 in which the aluminum alloy plate and the metal plate (copper plate) were subjected to the solid-phase diffusion bonding without forming the chill layer, it was confirmed that the heat resistance further increases in comparison to the examples. In addition, when comparing Comparative Example 2 in which nickel was used as the metal plate and Examples 4 and 9, it was confirmed that the heat resistance of Comparative Example 2 further increases. Similarly, when comparing Comparative Example 3 in which silver was used as the metal plate and Examples 5 and 10, it was confirmed that the heat resistance of Comparative Example 3 further increases. This is assumed to be because a Kirkendall void was formed.

In contrast, in the examples in which the thickness of the chill layer before bonding and the thickness of the chill layer after bonding were set in a range of the invention, it was confirmed that the heat resistance further decreases in comparison to the comparative examples. This is assumed to be because diffusion of a metal element that constitutes the metal plate is suppressed due to interposing of the chill layer having an appropriate thickness, and thus occurrence of the Kirkendall void is suppressed.

In addition, in Examples 6 to 10 to which the electrical heating method was applied, even when the bonding was performed in the atmosphere, the aluminum alloy plate and the metal plate were bonded in a satisfactory manner.

From the results, according to the invention, it was confirmed that the aluminum alloy member formed from an aluminum alloy having a relatively low solidus temperature, and the metal member formed from copper, nickel, or silver are bonded in a satisfactory manner, and thus it is possible to obtain a bonded body in which heat resistance in a laminating direction is low.

INDUSTRIAL APPLICABILITY

According to the invention, it is possible to provide a bonded body in which an aluminum alloy member formed from an aluminum alloy having a relatively low solidus temperature, and a metal member formed from copper, nickel, or silver are bonded to each other in a satisfactory manner, and heat resistance in a laminating direction is low, a power module substrate with heat sink and a heat sink which include the bonded body, a method of manufacturing a bonded body, and a method of manufacturing a power module substrate with heat sink, and a method of manufacturing a heat sink.

REFERENCE SIGNS LIST 10, 210: Power module substrate
11: Ceramic substrate
13, 213: Metal layer
13B: Cu layer (metal member)
31: Heat sink (aluminum alloy member)
35: Chill layer
101: Heat sink
110: Heat sink main body (aluminum alloy member)
117: Metal member layer
135: Chill layer

The invention claimed is:

1. A method of manufacturing a bonded body that is formed by bonding a metal member formed from copper, nickel, or silver, and an aluminum alloy member formed from an aluminum alloy of which a solidus temperature is lower than a eutectic temperature of aluminum and a metal element that constitutes the metal member,
    wherein a chill layer, in which a Si phase of which an aspect ratio of a crystal grain is 2.5 or less and a crystal grain diameter is greater than 1 μm and 15 μm or less is dispersed, is formed on a bonding surface side with the metal member in the aluminum alloy member before bonding, and the thickness of the chill layer is set to 80 μm or greater,
    the aluminum alloy member and the metal member are subjected to solid-phase diffusion bonding through the chill layer surface of the aluminum alloy member.

2. The method of manufacturing a bonded body according to claim 1, wherein the aluminum alloy member and the metal member are laminated, and are electrically heated while being pressurized in a laminating direction to subject the aluminum alloy member and the metal member to the solid-phase diffusion bonding.

3. A method of manufacturing a power module substrate with heat sink which includes an insulating layer, a circuit layer that is formed on one surface of the insulating layer, a metal layer that is formed on the other surface of the insulating layer, and a heat sink that is disposed on a surface, which is opposite to the insulating layer, of the metal layer,
wherein in the metal layer, a bonding surface with the heat sink is constituted by copper, nickel, or silver,
in the heat sink, a bonding surface with the metal layer is constituted by an aluminum alloy of which a solidus temperature is lower than a eutectic temperature of aluminum and a metal element that constitutes the bonding surface of the metal layer,
a chill layer, in which a Si phase of which an aspect ratio of a crystal grain is 2.5 or less and a crystal grain diameter is greater than 1 µm and 15 µm or less is dispersed, is formed on a bonding surface side with the metal layer in the heat sink before bonding, and the thickness of the chill layer is 80 µm or greater,
the heat sink and the metal layer are subjected to solid-phase diffusion bonding through the chill layer surface of the heat sink.

4. The method of manufacturing a power module substrate with heat sink according to claim 3,
wherein the heat sink and the metal layer are laminated, and are electrically heated while being pressurized in a laminating direction to subject the heat sink and the metal layer to the solid-phase diffusion bonding.

5. A method of manufacturing a heat sink including a heat sink main body and a metal member layer,
wherein the metal member layer is formed from copper, nickel, or silver,
the heat sink main body is constituted by an aluminum alloy of which a solidus temperature is lower than a eutectic temperature of aluminum and a metal element that constitutes the metal member layer,
a chill layer, in which a Si phase of which an aspect ratio of a crystal grain is 2.5 or less and a crystal grain diameter is greater than 1 µm and 15 µm or less is dispersed, is formed on a bonding surface side with the metal member layer in the heat sink main body before bonding, and the thickness of the chill layer is set to 80 µm or greater,
the heat sink main body and the metal member layer are subjected to solid-phase diffusion bonding through the chill layer surface of the heat sink.

6. The method of manufacturing a heat sink according to claim 5,
wherein the heat sink main body and the metal member layer are laminated, and are electrically heated while being pressurized in a laminating direction to subject the heat sink main body and the metal member layer to the solid-phase diffusion bonding.

7. A method of manufacturing a bonded body that is formed by
forming a chill layer on one surface of an aluminum alloy member;
solid-phase diffusion bonding a metal member formed from copper, nickel, or silver, and the aluminum alloy member through the chill layer surface of the aluminum alloy member;
wherein the aluminum alloy member formed from an aluminum alloy of which a solidus temperature is lower than a eutectic temperature of aluminum and a metal element that constitutes the metal member,
wherein the chill layer, in which a Si phase of which an aspect ratio of a crystal grain is 2.5 or less and a crystal grain diameter is 1 µm or more and 15 µm or less is dispersed, is formed on a bonding surface side with the metal member in the aluminum alloy member before bonding, and the thickness of the chill layer is set to from 100 µm to 1000 µm.

\* \* \* \* \*